(12) United States Patent
Ballandras et al.

(10) Patent No.: US 11,437,973 B2
(45) Date of Patent: Sep. 6, 2022

(54) SURFACE ACOUSTIC WAVE DEVICE ON COMPOSITE SUBSTRATE

(71) Applicant: FREC'N'SYS, Besançon (FR)

(72) Inventors: Sylvain Ballandras, Besançon (FR); Florent Bernard, Besançon (FR); Emilie Courjon, Franois (FR)

(73) Assignee: FREC'N'SYS, Besançcon (FR)

( * ) Notice: Subject to any disclaimer, the term of this patent is extended or adjusted under 35 U.S.C. 154(b) by 10 days.

(21) Appl. No.: 17/042,768

(22) PCT Filed: Mar. 20, 2019

(86) PCT No.: PCT/EP2019/056933
§ 371 (c)(1),
(2) Date: Sep. 28, 2020

(87) PCT Pub. No.: WO2019/185415
PCT Pub. Date: Oct. 3, 2019

(65) Prior Publication Data
US 2021/0028760 A1    Jan. 28, 2021

(30) Foreign Application Priority Data

Mar. 28, 2018 (FR) ...................................... 1852687

(51) Int. Cl.
*H03H 9/02* (2006.01)
*H03H 9/25* (2006.01)
*H03H 9/64* (2006.01)

(52) U.S. Cl.
CPC .... *H03H 9/02559* (2013.01); *H03H 9/02574* (2013.01); *H03H 9/02582* (2013.01); *H03H 9/02834* (2013.01); *H03H 9/25* (2013.01); *H03H 9/6406* (2013.01)

(58) Field of Classification Search
CPC .. H03H 9/02; H03H 9/02559; H03H 9/02574; H03H 9/02582; H03H 9/25; H03H 9/6406
See application file for complete search history.

(56) References Cited

U.S. PATENT DOCUMENTS

| | | | | |
|---|---|---|---|---|
| 5,432,392 | A * | 7/1995 | Kadota | H03H 9/02574 333/155 |
| 7,800,464 | B2 * | 9/2010 | Tajima | H03H 9/02574 333/133 |
| 2015/0319537 | A1 | 11/2015 | Perois et al. | |

(Continued)

OTHER PUBLICATIONS

International Search Report for International Application No. PCT/EP2019/056933 dated Jun. 21, 2019, 4 pages.

(Continued)

*Primary Examiner* — Dean O Takaoka
(74) *Attorney, Agent, or Firm* — TraskBritt

(57) ABSTRACT

A surface acoustic wave device using a longitudinally polarized guided wave comprises a composite substrate comprising a piezoelectric layer formed over a base substrate, wherein the crystalline orientation of the piezoelectric layer with respect to the base substrate is such that, the phase velocity of the longitudinally polarized wave is below the critical phase velocity of the base substrate at which wave guiding within the piezoelectric layer vanishes. A method of fabrication of such surface acoustic wave device is also disclosed.

20 Claims, 11 Drawing Sheets

(56) References Cited

U.S. PATENT DOCUMENTS

2017/0222618 A1    8/2017  Inoue et al.
2018/0048282 A1    2/2018  Kurimoto et al.

OTHER PUBLICATIONS

International Written Opinion for International Application No. PCT/EP2019/056933 dated Jun. 21, 2019, 7 pages.
M. Pereira Da Cunha, PSAW and HVPSAW Behaviour in Layered Structures, Microwave and Optoelectronics Conference, (1997), vol. 1, pp. 109-114, (abstract only).
Natalya Naumenko, Multilayered Structure as a Novel Material for Surface Acoustic Wave Devices: Physical Insight, Acoustic Waves—From Microdevices to Helioseismology, (Nov. 14, 2011), pp. 421-442.
T. Makkonen, Surface-Acoustic-Wave Device for the 2.5-5 Frequency Range Based on Longitudinal Leaky Waves, Applied Physics Letters, vol. 8, No. 19, (May 12, 2003), pp. 3351-3353.

\* cited by examiner

SURFACE ACOUSTIC WAVE DEVICE ON COMPOSITE SUBSTRATE

CROSS-REFERENCE TO RELATED APPLICATIONS

This application is a national phase entry under 35 U.S.C. § 371 of International Patent Application PCT/EP2019/056933, filed Mar. 20, 2019, designating the United States of America and published in English as International Patent Publication WO 2019/185415 A1 on Oct. 3, 2019, which claims the benefit under Article 8 of the Patent Cooperation Treaty to French Patent Application Serial No. 1852687, filed Mar. 28, 2018.

TECHNICAL FIELD

The present disclosure relates to a surface acoustic wave device, and a method of fabrication of the surface acoustic wave device, in particular, on a composite substrate.

BACKGROUND

In recent years, surface acoustic wave (SAW) devices have been employed in an increasing number of practical applications, such as filters, sensors and delay lines. In particular, SAW filters are interesting for mobile phone applications due to their ability to form low loss high order bandpass filters without employing complex electrical circuits with unprecedented compactness. Therefore, SAW filters provide significant advantages in performance and size over other filter technologies.

In a typical surface acoustic wave device, one or more inter-digitated transducers (IDTs) are used to convert acoustic waves to electrical signals and vice versa by exploiting the piezoelectric effect. An inter-digitated transducer comprises opposing "electrode combs" with inter-digitated metal fingers disposed on a piezoelectric substrate. A Rayleigh surface acoustic wave develops on the substrate by electrically exciting the fingers. The other wave types, shear and longitudinally polarized wave, travel in the volume and get absorbed. The SAW device can also be used in the opposite way, namely an electrical signal can be induced across the fingers by a surface acoustic wave propagating in the piezoelectric substrate material beneath the transducer.

SAW devices commonly use wafers made from a monolithic Quartz, $LiNbO_3$ or $LiTaO_3$ crystal as piezoelectric materials. However, the use of piezoelectric substrates leads to either high sensibility to temperature or weak electromechanical coupling depending on the piezoelectric material used. This results in poor performance of the filters' passband characteristics. Furthermore, elastic wave velocities are generally limited by the single crystal material properties, particularly considering phase velocity, which remains between 3000 and 4000 m/s most of the time.

One approach to overcome this has led to the use of composite substrates. A composite substrate comprises a piezoelectric layer formed over a base substrate. A composite substrate gives a large choice of materials for the base substrate and base substrate materials with high acoustic wave propagation velocity can be chosen, such as diamond, sapphire, silicon carbide and even silicon.

It is also possible to reduce the temperature sensibility of a SAW device when using a composite substrate compared to a device fabricated on a piezoelectric substrate by adjusting the materials being used considering their temperature coefficient of frequency (TCF). For example, it is possible to use two materials with opposite TCF, which results in SAW devices that are spectrally more stable over temperature. It is also possible to use a substrate that exhibits a thermal expansion smaller than the one of the top piezoelectric layer, therefore, imposing the composite thermal expansion and yielding reduction of the TCF as well.

Finally, the choice of materials, their combination, their orientation and the thickness of the top piezoelectric layer offer a wide range of design possibilities compared to the use of piezoelectric substrates alone, which gives room for improving the SAW devices in the field of filtering of high frequencies. Composite substrates combine strong coupling, i.e., electromechanical coefficient $k_s^2$ larger than 1%, and temperature stability, i.e., a temperature coefficient of frequency (TCF) smaller than 20 ppm/K, and can improve the performance of the SAW devices and gives flexibility of design.

However, SAW devices are typically used for frequencies up to 2 GHz, which is due to the lithography technology used to create the inter-digitated comb electrode structures. Indeed, the lithography technology used so far is an I-line lithography, making it possible to reach at best a wavelength of 1.5 µm. For a Rayleigh surface wave mode propagating at 3000 m/s, the accessible frequency limit is, therefore, 2 GHz. Therefore, to create SAW devices above 2 GHz, a strong technological effort is required.

BRIEF SUMMARY

The object of the present disclosure is thus to provide a surface acoustic wave SAW device that can function for frequencies exceeding 2 GHz but that can still be manufactured using standard I-line lithography.

The object of the present disclosure is achieved by a surface acoustic wave device using a longitudinally polarized guided wave comprising a composite substrate comprising a piezoelectric layer formed over a base substrate, wherein the crystalline orientation of the piezoelectric layer with respect to the base substrate is such that, the phase velocity of the longitudinally polarized wave is below the critical phase velocity of the base substrate at which wave guiding within the piezoelectric layer vanishes. This critical phase velocity is generally identified in the literature as the Surface Skimming Bulk Wave (SSBW) velocity limit of the single crystal or of the base substrate in case of composite materials.

In such device, due to the relative crystalline orientation of the piezoelectric layer with respect to the base substrate, not only the Rayleigh wave travels in the piezoelectric layer but also the longitudinally polarized wave remains guided in the piezoelectric layer. As the speed of this wave is higher than the speed of the Rayleigh wave, it becomes possible to extend the frequency range of the SAW device using the same IDT dimensions. For composite substrates comprising a top piezoelectric layer over a base substrate, the presence of a base substrate with high acoustic wave propagation velocity such as diamond, sapphire, silicon carbide and even silicon, the above-mentioned SSBW velocity limit $V_{SSBW}$ is fixed by the shear wave velocity given at first order approximation by $\sqrt{(C_{44}/\rho s)}$, with $C_{44}$ being the effective shear elastic constant and $\rho s$ the mass density of the base substrate, assuming cubic substrate properties. Therefore, any wave excited and propagating in the top layer, for instance, the piezoelectric layer cited above, i.e., Quartz, $LiNbO_3$ or $LiTaO_3$, with a phase velocity smaller than the above defined SSBW velocity limit will be guided by the base substrate in the top piezoelectric layer. The phenomena observed is similar to the operation of an optical waveguide.

According to one embodiment of the present disclosure, the piezoelectric layer can be a single crystal. A single crystal layer improves the guiding of the longitudinally polarized wave within the piezoelectric layer over a large distance when meeting the above phase velocity condition.

According to a variant of the present disclosure, the thickness of the piezoelectric layer can be on the order of the sub-wavelength range or smaller, in particular in a range between 300 nm and 700 nm, preferably 500 nm. In this thickness range, it becomes possible to concentrate the electromechanical field within the piezoelectric layer, which will result in an improved electromechanical coupling and spectral purity allowing for single, or at least limited number of, mode contribution to the device response.

According to a variant of the present disclosure, the base substrate can have a shear wave velocity greater than 5600 m/s. The base substrate can be a silicon substrate, in particular with a surface orientation (100) or a sapphire, silicon carbide, carbon diamond or diamond substrate.

According to a variant of the present disclosure the surface acoustic wave device can further comprise a dielectric layer, in particular a $SiO_2$ layer, sandwiched between the base substrate and the piezoelectric layer. The dielectric or passivation layer can improve the attachment of the piezoelectric layer over the base substrate but can also improve the electromechanical coupling while keeping temperature stability of the surface acoustic wave device. Preferably, the dielectric layer has a thickness of less than 800 nm, in particular a thickness in a range of 100 to 650 nm, more in particular in a range of 600 to 650 nm. The thickness of the $SiO_2$ layer can be optimized according to the thermoelastic properties of the top layer and the base substrate. The thickness of the oxide layer may also be optimized for mode guiding improvement as it influences the mode velocity as well.

According to a variant of the present disclosure, the piezoelectric layer of the composite substrate can be lithium tantalate ($LiTaO_3$) or lithium niobate ($LiNbO_3$).

According to a variant of the present disclosure, the piezoelectric layer can be a lithium tantalate ($LiTaO_3$) layer with a crystallographic orientation defined as (YX/t)/θ/Ψ according to the standard IEEE 1949 Std-176, with θ, an angle of the crystallographic orientation being between 40° and 65°, in particular for θ on the order of 42° or on the order of 62°, corresponding to a (YX/)/42° cut or a (YX/)/62° cut. Preferably, the propagation direction of the longitudinally polarized guided wave Ψ is set at 90° of the crystallographic X-axis. More preferably, the base substrate comprises silicon. In this particular direction, a fast propagation velocity of around 5350 m/s up to 5650 m/s and a TCF comprised between −20 ppm/K and −5 ppm/K and a $k_s^2$ value from about 0.5% to 2% or more can be observed.

According to a variant of the present disclosure a relative thickness h/λ and/or a metallization ratio w/ρ of the electrode fingers of a transducer structure on the piezoelectric layer, h and w being the thickness and width of the electrode fingers, respectively, and ρ and λ being the electrode pitch and the wavelength of the transducer structure, respectively, can be chosen such that the electromechanical coupling $k_s^2$ of the longitudinally polarized guided wave in the piezoelectric layer is between 0.5% and 2.5%, in particular, above 2%. By varying the structural characteristics of the transducer structure, namely the relative thickness h/λ and/or the metallization ratio w/ρ of the electrode fingers of the transducer structure, it is possible to optimize the electrochemical coupling $k_s^2$ for the longitudinally polarized guided wave in the piezoelectric layer, in order to obtain the required electrochemical coupling coefficient $k_s^2$ and the temperature stability of the composite substrate for the desired applications of the SAW device.

According to an embodiment, the piezoelectric layer can be a lithium niobate ($LiNbO_3$) layer with a (YX/t)/θ/Ψ cut according to the standard IEEE 1949 Std-176. Preferably, the base substrate comprises diamond. In particular, the propagation direction of the longitudinally polarized guided wave Ψ is set at 90° of the crystallographic X-axis. More in particular, when θ is comprised between 35 and 400 or between 100 and 150°, with this particular propagation direction, a fast propagation velocity of 7000 m/s and an electromechanical coupling $k_s^2$ value from about 11% to 20% or more can be observed.

According to an embodiment, the piezoelectric layer can be a lithium niobate ($LiNbO_3$) layer with a crystallographic orientation defined as (YX/t)/θ/Ψ according to the standard IEEE 1949 Std-176, with θ, an angle of the crystallographic orientation being between 40° and 60°, in particular for θ on the order of 41°, corresponding to a (YX/)/41° cut. Preferably, the propagation direction of the longitudinally polarized guided wave Ψ of the crystallographic X-axis is comprised 80° and 100°, in particular on the order of 90°, for a (YX/t)/41°/90° cut. Preferably, the base substrate comprises sapphire, in particular a (YX/t)/50°/90° cut sapphire. In particular, the propagation direction of the longitudinally polarized guided wave Ψ is set at 90° of the crystallographic X-axis. With this particular composite substrate, a fast propagation velocity of on the order of 6700 m/s and an electromechanical coupling $k_s^2$ value from about 6% up to 10% can be observed.

The object of the present disclosure is also achieved by a surface acoustic wave filter device comprising at least one surface acoustic wave (SAW) device as described previously. Such surface acoustic wave filter device can yield filter bandpass comprised between 0.1 and 1%, with reduced first order temperature coefficient of frequency (TCF1), resulting in device performances being stable with temperature.

The object of the present disclosure is also achieved by a surface acoustic wave resonator device comprising at least one surface acoustic wave (SAW) device as described previously. Such surface acoustic wave filter device can obtain narrow filter bandpass smaller than 1%, with reduced first order temperature coefficient of frequency (TCF1), resulting in device performances being stable with temperature.

The object of the present disclosure is also achieved by the method of fabrication of a surface acoustic wave device as described above, the method comprising the steps of a) providing a piezoelectric layer over a base substrate, b) providing a transducer structure on the piezoelectric layer, wherein in step a) the piezoelectric layer is provided such that the piezoelectric layer has a crystalline orientation with respect to the base substrate such that, the phase velocity of the longitudinally polarized wave is below the critical phase velocity of the base substrate at which wave guiding within the piezoelectric layer vanishes.

According to a variant of the present disclosure, at least one of the steps a) or b) of the method of fabrication of a surface acoustic wave device as described above is a layer transfer process. It is, for example, possible to use a SMART CUT® process, in which a transfer of a layer of a first substrate onto a base substrate is carried out by propagation of a fracture wave along an interface in the first substrate weakened previously by ion implantation, during thermal annealing. The transferred layer can be the piezoelectric layer or any other layer or combination of layers in the surface acoustic wave device.

According to a preferred embodiment, step b) can comprise an I-line lithography patterning step to obtain a transducer structure in the surface acoustic wave device, allowing a frequency limit of more than 2 GHz, in particular more than 3.5 GHz. Thus compared to a Rayleigh surface wave using device, which has its frequency limited at 2 GHz, it becomes possible to extend the frequency range without having to change the patterning technology.

BRIEF DESCRIPTION OF THE DRAWINGS

The present disclosure may be understood by reference to the following description taken in conjunction with the accompanying figures, in which reference numerals identify features of embodiments of the present disclosure.

DETAILED DESCRIPTION

Figure 1A:
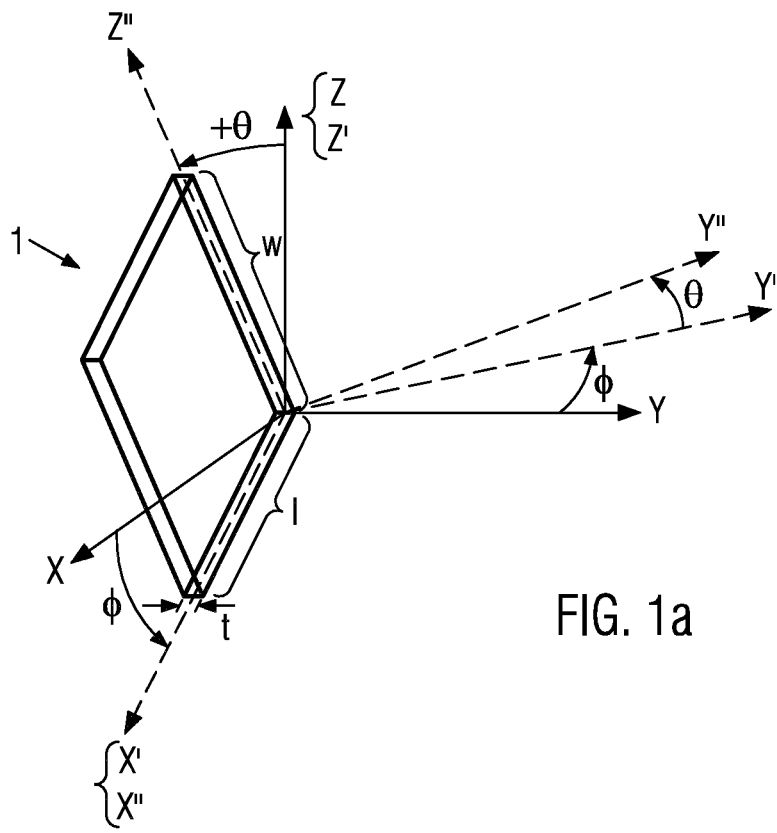
FIG. 1a illustrates the cutting angles defined according to the IEEE Std-176 standard.
Figure 1B:
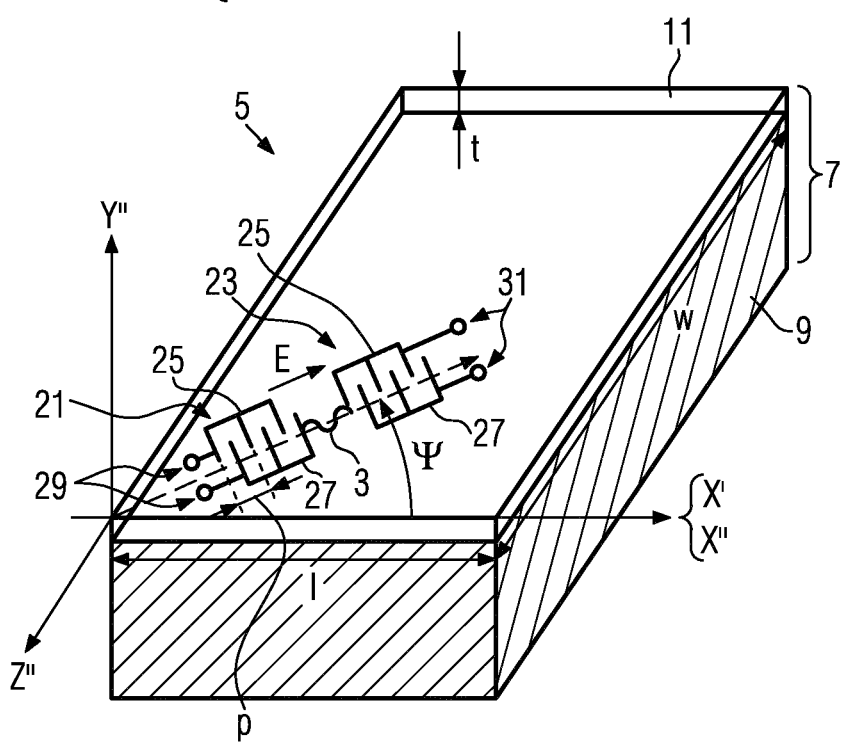
FIG. 1b shows a surface acoustic wave device according to the present disclosure and illustrating an elastic wave propagation direction.

FIG. 1a illustrates the cutting angles defined according to the standard IEEE 1949 Std-176 and FIG. 1b illustrates an elastic wave propagation direction in a surface acoustic wave (SAW) device 5 according to the present disclosure.

A crystal cut is defined by two angles of rotation. A cut is defined in standard IEEE 1949 Std-176 by the axes defined by the thickness t and length l of the blank 1 and by angles of rotation about the axes defined by the width w, the length l and the thickness t of the blank 1. The Z-axis is defined by the width w of the blank 1, the X-axis by the length l and the Y-axis by the thickness t. These axes being understood in principle to be those after rotation, i.e., for a cut involving three rotations the rotation φ about the Z-axis (w) is first carried out, leading to the X-axis X'(l) and Y-axis Y'(t). The rotation θ about X'(l) is then carried out leading to the rotated Z-axis Z''(w) and the rotated Y-axis Y''(t). The crystal cut would then be noted as (YXwl)/φ/θ.

Furthermore, any cut such that φ=0 and θ≠0 is called a single rotation cut, noted then (YX/)/θ, and any cut such that φ≠0 and θ≠0 is called a double rotation cut.

As illustrated in FIG. 1b, for the propagation of surface acoustic waves 3, a third angle, denoted Ψ, defines the propagation direction of the surface wave 3. The angle is defined by a rotation about the axis Y''. In this case, the crystal cut would be noted as (YX/t)/θ/Ψ.

FIG. 1b illustrates schematically a SAW device 5 comprising a composite substrate 7 according to the present disclosure. The composite substrate 7 comprises a base substrate 9 and a piezoelectric layer 11.

The base substrate 9 is a silicon base substrate with a surface orientation (100). The silicon base substrate 9 has an acoustic SSBW velocity limit on the order of 5650 m/s. Instead of a silicon substrate, sapphire, or, in general, any substrate material showing a shear wave velocity greater than 5600 m/s would be suitable.

For a silicon substrate, a (100) orientation is used but (100) or (010) could also be used. Indeed, when using propagation directions along the X (±10°) or the Z (±10°) crystallographic axis, the SSBW phase velocity criterion are met. Computations based on Green's functions show that this SSBW velocity can reach a value in excess of 5750 m/s for silicon cut (YX/t)/45°/0° or also noted (YX/)/45°. Also, crystal cut defined as (YX/t)/45/90° is found to maximize the SSBW velocity at 5770 m/s.

For sapphire, identical computations have been made, showing that a SSBW velocity of 5750 m/s is the lowest achievable phase velocity. However, the SSBW velocity overcomes 6700 m/s for crystal cut (YX/t)/θ/Ψ with 40°<θ<60° and 80°<Ψ<100°. With such a substrate, it is possible to guide the longitudinal wave excited in a $LiNbO_3$ layer using adapted layer thicknesses. For instance, considering a longitudinal wave excited on a (YX/t)/41°/90° $LiNbO_3$ layer of 700 nm onto a $SiO_2$ layer of 800 nm, both layers being deposited on a (YX/t)/50°/90° sapphire substrate, allows for bulk radiation suppression and the guiding of a longitudinal wave mode with an electromechanical coupling in excess of 6% and potentially up to 10%, considering an operation frequency of 2 GHz.

The piezoelectric layer 11 in this embodiment is a single crystal lithium tantalate ($LiTaO_3$) with a crystallographic orientation defined as (YX/)/θ according to the standard IEEE 1949 Std-176, with θ, an angle of the crystallographic orientation being between 40° and 65°, more in particular for θ close to 42° or close to 62°. According to a variant of the disclosure, the piezoelectric layer 11 can also be a single crystal lithium niobate ($LiNbO_3$) layer. The thickness of the piezoelectric layer 11 is on the order of the wavelength λ of the waves 3 of the SAW device 5 or below. Typically it has a thickness in a range between 300 nm and 700 nm, in particular 500 nm, in particular, suitable for an operation in the 2 to 4 GHz frequency range.

According to a variant of the present disclosure, the composite substrate 7 may further comprise a dielectric layer, in particular, a $SiO_2$ layer (not shown). The dielectric layer may be sandwiched between the base substrate 9 and the piezoelectric layer 11. The presence of the dielectric layer can modify the electrochemical coupling coefficient $k_s^2$ as well as the temperature stability of the composite substrate 7. This influence depends on the thickness of the layer, which, therefore, represents a parameter to optimize the properties of the composite substrate 7 to obtain the required electrochemical coupling coefficient $k_s^2$ and the temperature stability of the composite substrate for the desired applications of the SAW device 5. Typically, the thickness of a $SiO_2$ layer as dielectric layer is less than 800 nm, in particular in a range between 100 nm and 650 nm, more in particular in a range between 600 nm and 650 nm, in particular suitable for an operation in the 2 to 4 GHz frequency range.

The surface acoustic wave device 5 further comprises two transducer structures 21 and 23 on the piezoelectric layer 11. The transducer structures 21 and 23 in this embodiment are the same, but according to a variant, the transducer structures 21 and 23 can be different or only one transducer structure might be present. The surface acoustic wave device 5 can further comprise one or more resonator structures.

The transducer structures 21 and 23 each comprises opposing inter-digitated comb electrodes 25 and 27, each of which has a plurality of electrode fingers. The inter-digitated comb electrodes 25 and 27 and the electrode fingers are formed of any suitable conductive metal, for example, aluminum or aluminum alloy.

An electrical load and/or source potential 29, 31 can respectively be coupled across the inter-digitated comb electrodes 25, 27 of the transducer structures 21, 23, depending upon whether the transducer structures 21, 23 are utilized to excite surface acoustic waves 3 in the composite substrate 7 or to convert received surface acoustic waves to electrical signals, or both. The inter-digitated electrode fingers are then connected to alternating potentials.

The transducer structure 21 and/or 23 excite the surfaces acoustic waves in the electrical field direction, meaning perpendicularly to the extension direction of the electrode fingers of the inter-digitated comb electrodes 25, 27 as shown by the arrow E in the FIG. 1b, thus along the propagation direction defined by $\Psi$.

The frequency of utilization $f_r$ of the SAW device 5 is defined by $f_r = v/2\rho$, v being the velocity of the acoustic wave and $\rho$, the electrode pitch of the transducer structures 21, 23, as shown in FIG. 1b. The electrode pitch $\rho$ of the transducer structure is also chosen to be $\lambda/2$, $\lambda$ being the operating wavelength of the acoustic wave. Thus, the electrode pitch $\rho$ defines the frequency of utilization of the transducer structure, and corresponds to the edge-to-edge electrode finger distance between two neighboring electrode fingers connected to different comb electrodes, as illustrated in FIG. 1b. Furthermore, the transducer structure operates at the Bragg condition, defined by $\rho = \lambda/2$.

In this embodiment, the inter-digitated electrode fingers typically all have essentially the same length d, width w and thickness h (not shown). According to variants of the present disclosure, they could also be different.

The propagation characteristics of the surface acoustic waves 3 produced by the SAW device 5 include among others propagation phase velocity, electromechanical coupling coefficient $k_s^2$ and the temperature coefficient of frequency TCF. The propagation phase velocity affects the relationship between the electrode pitch $\rho$ of the transducer structure and the desired frequency of the device.

Furthermore, in case of a use of the SAW device 5 in a filter device application, the bandwidth of the filter $\Delta f$ is proportional to the electromechanical coupling coefficient $k_s^2$ considering the empirical relation $\Delta f/f \sim (2/3) k_s^2$, $\Delta f$ corresponding to the bandpass width in frequency of the filter, $f_r$ being the resonant frequency of the transducer structure. The TCF is associated with the influence of a temperature to the frequency changes in filters.

The thermal sensitivity is characterized by the $TCF_1$ and $TCF_2$ around the ambient temperature $T_0 = 25°$ C. This definition was proposed first in J. J. Campbell and W. R. Jones, IEEE Trans. Sonics Ultrasonics 15, 209 (1968), for SAW devices and is widely used and known by the skilled person in the art. Its expression reads as follows:

$$f = f_0 \times (1 + TCF_1(T-T_0) + TCF_2(T-T_0)^2)$$

This expression corresponds to a polynomial development of the temperature-frequency dependence limited to the second degree as generally for SAW on standard devices. $TCF_1$ and $TCF_2$ can be accurately obtained by using best fit procedures considering experimental frequency-temperature measurements for a given magnitude/phase point of the transfer function or the reflection coefficient or self-admittance, transadmittance or self-impedance or transimpedance of the filter.

Figure 2A:
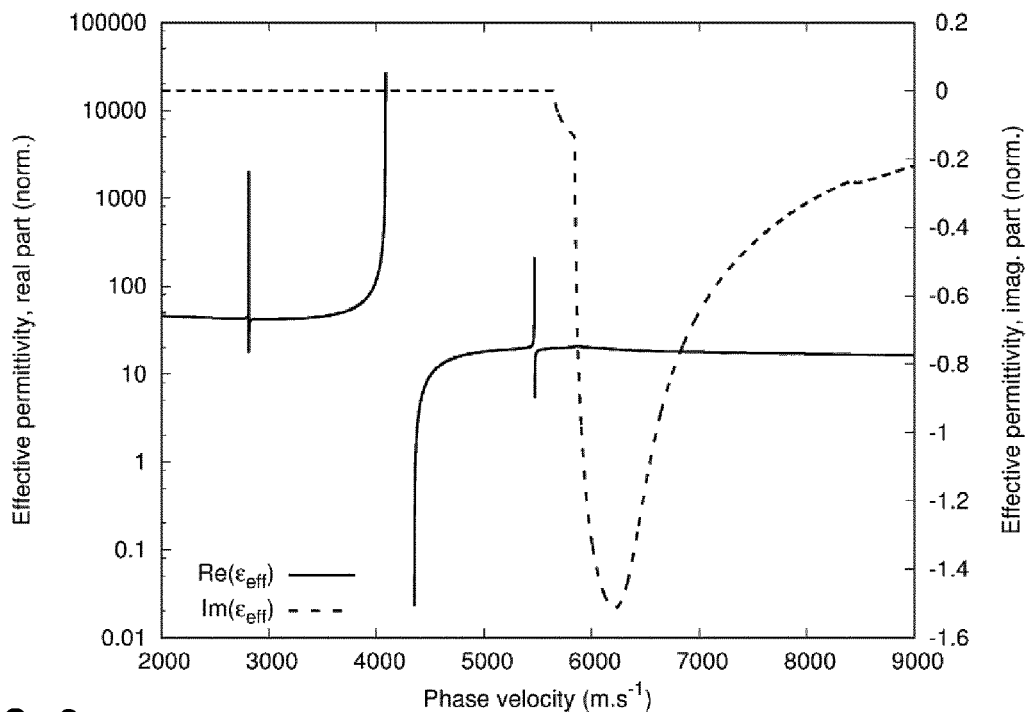
FIGS. 2a and 2b show a graph of the effective permittivities calculated for two different propagation directions of the SAW device as illustrated in FIG. 1b.
Figure 2B:
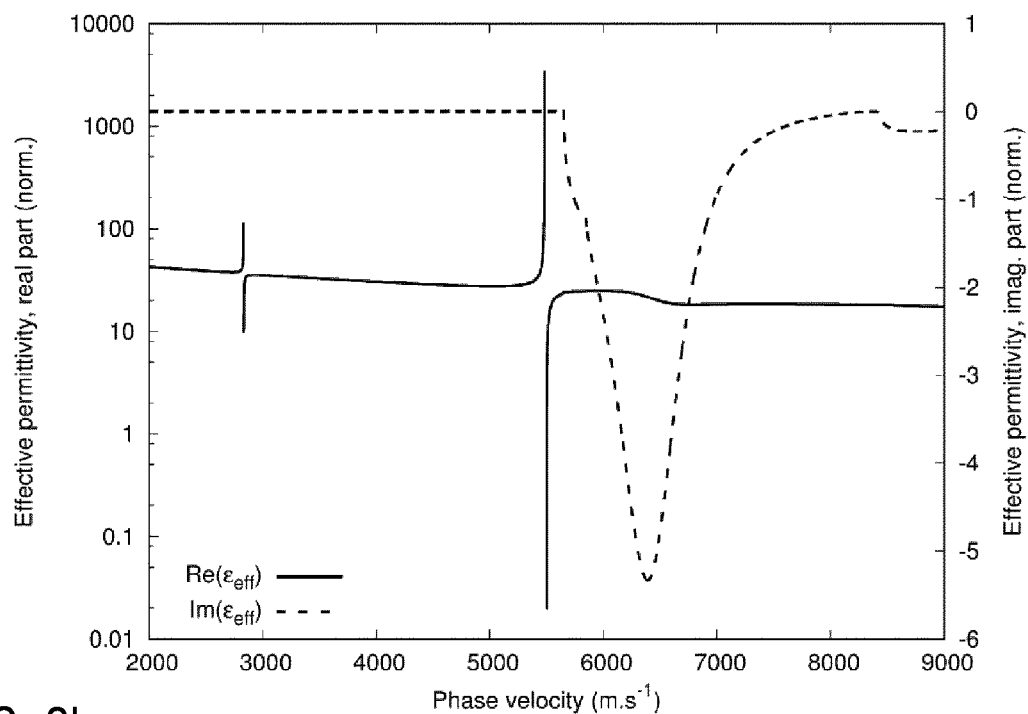

FIGS. 2a and 2b illustrate the effective permittivities calculated for two different orientations of the composite substrate 7, with the piezoelectric layer 11 being a layer of $LiTaO_3$ with a thickness of 500 nm on a base substrate 9 of silicon (100).

FIG. 2a shows the permittivity for a 42° Y-cut, X-propagation, thus a (YX/)/42° cut, and FIG. 2b the permittivity in case of a rotation of 90° around Y', thus a (YX/t)/42/90° cut, according to the standard IEEE 1949 Std-176. FIGS. 2a and 2b plot the imaginary part of the effective/relative permittivity on the right Y axis and the real part of the effective/relative permittivity on the left Y axis against the phase velocity in m/s on the X axis.

The relative permittivity of a material is its absolute permittivity expressed as a ratio relative to the permittivity of vacuum. Permittivity is a material property that affects the Coulomb force between two point charges in the material. Relative permittivity is the factor by which the electric field between the charges, located here under the inter-digitated electrode fingers, is decreased relative to vacuum. Likewise, relative permittivity is the ratio of the capacitance of a capacitor using that material as a dielectric, compared with a similar capacitor that has vacuum as its dielectric. Relative permittivity is also commonly known as dielectric constant.

In FIG. 2a, the graph is shown for $LiTaO_3$ piezoelectric layer 11 with the (YX/)/42° cut. As can be seen, three acoustic modes can propagate in the piezoelectric layer of lithium tantalate ($LiTaO_3$) layer. The acoustic modes are present at 2800 m/s, 4300 m/s and 5400 m/s. These three modes correspond to the three types of acoustic waves present in the piezoelectric layer: the Rayleigh acoustic wave, the shear wave and the longitudinally polarized mode, respectively.

In the composite substrate 7, the maximum propagation velocity of the mode corresponding to the longitudinally polarized guided wave in the lithium tantalate piezoelectric layer 11 is actually bounded by the shear acoustic wave velocity of the base substrate. In the present case, the later velocity is the one of silicon (100), thus of a value of about 5650 m/s. Above that threshold, the wave is radiated in the base substrate and consequently the corresponding losses dramatically increase, in proportion with the amount of energy radiated from the surface of the lithium tantalate piezoelectric layer 11 to the base substrate.

In FIG. 2b, the graph shown corresponds to a crystalline orientation of the lithium tantalate ($LiTaO_3$) being a 42° Y-cut, X-propagation with a 90° rotation around Y', thus a (YX/t)/42/90° cut. As can be seen, only two acoustic modes are now present, the ones at 2800 m/s and at 5400 m/s. The acoustic mode at 4300 m/s, corresponding to the shear waves, has disappeared.

Basically, by choosing the propagation direction at 90° with respect to the crystallographic X axis, the shear wave mode is no longer excited, and only the Rayleigh wave mode and the longitudinally polarized volume mode are propagating inside the piezoelectric layer 11.

Therefore, in the composite substrate 7 according to the present disclosure, with a silicon base substrate (100) 9 and a (YX/)/42° or a (YX/t)/42°/90° cut piezoelectric LiTaO$_3$ layer 11 of 500 nm, it is possible to guide modes that have a propagation velocity on the order of the base substrate, here namely 5640 m/s inside the piezoelectric layer 11. Due to the special crystalline orientation of the piezoelectric layer 11, the phase velocity is such that it remains below the critical phase velocity at which the longitudinally polarized volume wave would not be confined inside the piezoelectric layer 11 but would vanish into the base substrate 9.

FIGS. 3a to 3d illustrate properties of a composite substrate with a silicon (100) base substrate, a 200 nm thick SiO$_2$ dielectric layer and a 500 nm thick LiTaO$_3$ piezoelectric layer.

As already illustrated in FIGS. 2a and 2b, in a composite substrate according to the present disclosure, it is possible to guide modes that have a propagation velocity close but smaller than the SSBW velocity limit of the substrate, here namely 5400 m/s inside the piezoelectric layer. These modes will be referenced to as "high velocity" modes.

Indeed, since the temperature expansion coefficient of silicon is in the vicinity of 2.6 ppm/° C., while, for example, that of (YX/)/42° LiTaO$_3$ is approximately 16 ppm/° C., the combined temperature expansion coefficient of the SAW device will be generally within the range of 2.6 to 16 ppm/° C., depending upon the thickness of the piezoelectric layer and the stress level at the bonding interface. The effective lowering of the temperature expansion coefficient of the composite substrate results in a reduced temperature coefficient of frequency (TCF) of the transducer structure deposited on top of the composite substrate.

Furthermore, the propagation velocity of this "high velocity" mode is particularly attractive for direct band synthesis, eliminating the frequency multiplication stages necessary to obtain the target value starting from a low (<30 MHz) or intermediaries (between 300 and 600 MHz, for example) frequency source multiplied to reach Ultra High Frequency (UHF) or S or C bands. The maximum frequency achievable with such a mode by using an I-line type of lithography (UV 365 nm) is around 4 GHz; i.e., considering a velocity of 5500 m/s and a wavelength of 1.4 µm, this gives an electrode width of about 350 nm. Therefore, it is possible to directly design the resonator at the final operating frequency using standard SAW-industry technology.

Figure 3A:
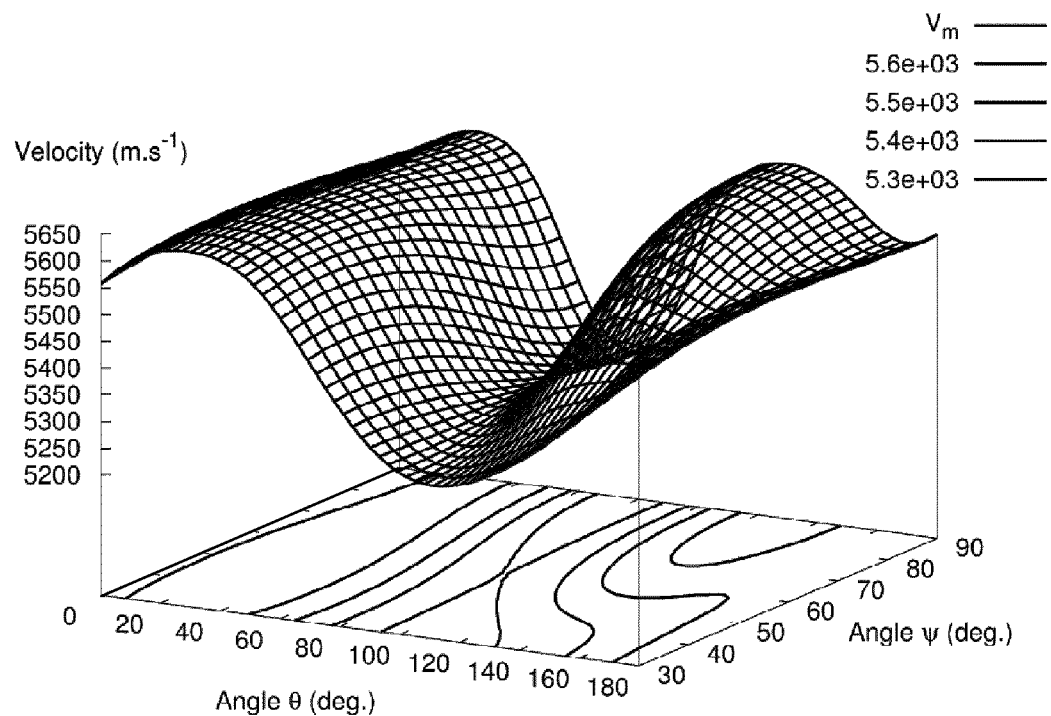
FIGS. 3a-3d illustrate the characteristics of a surface acoustic wave device using a composite substrate according to the present disclosure with a $SiO_2$ layer of 200 nm.
Figure 3B:
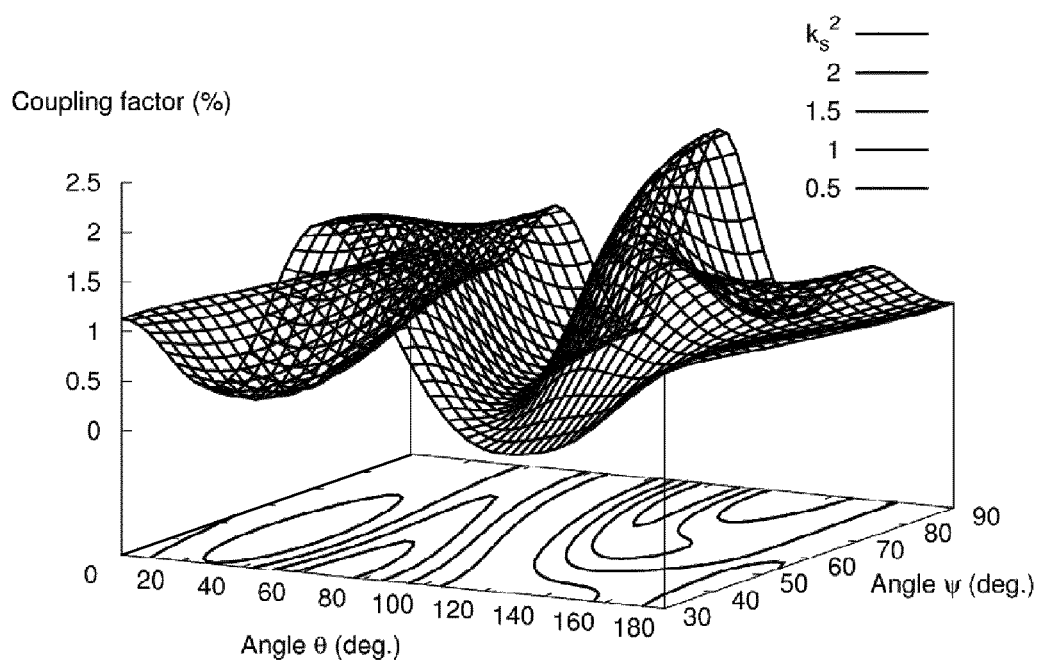
Figure 3C:
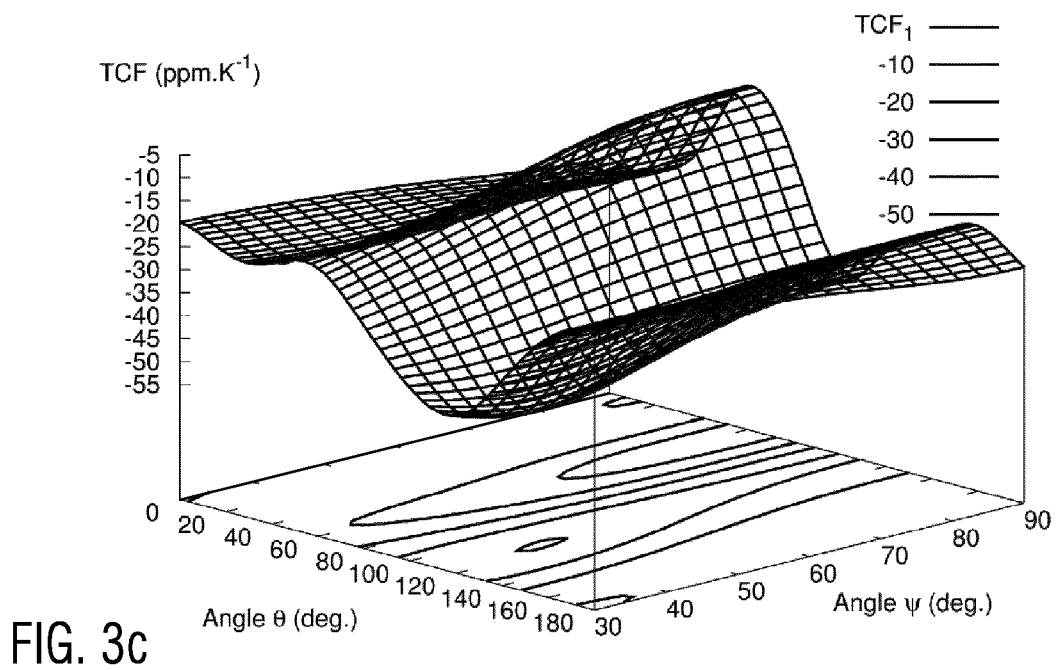

FIGS. 3a to 3c respectively illustrate the phase velocity of the longitudinally polarized guided wave, the electromechanical coupling and the TCF value as a function of the rotation angle θ of the cut of the piezoelectric layer and the propagation direction angle Ψ.

Figure 3D:
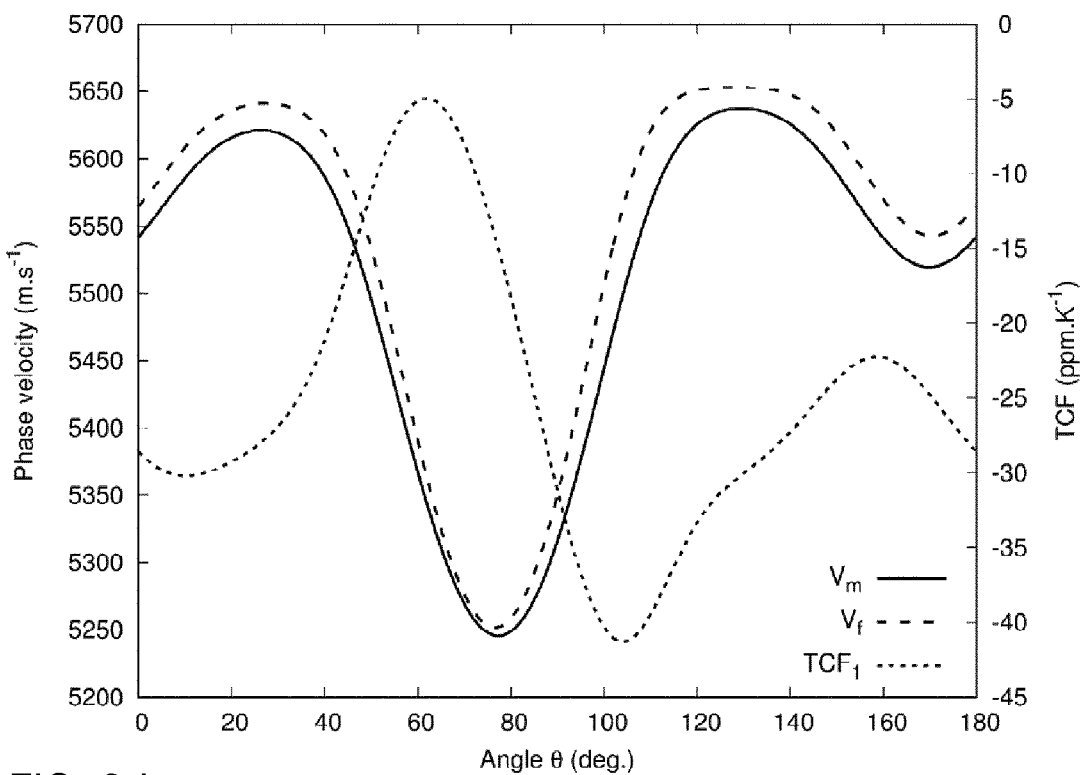

FIG. 3d shows the variations of the propagation velocity (m/s) on the left Y axis and of the TCF (ppm/K) on the right Y axis, for varying angles of crystal orientation θ plotted on the X axis for Ψ=90°. The propagation velocities for both the metallized surface, thus with the transducer structure, and the free surface, without metallic surface, are shown.

FIGS. 3a to 3c illustrate that the three desired parameters, high velocity, TCF close to zero and high electromechanical coupling cannot be optimized at the same time. The frequency is set to 2 GHz. Nevertheless the propagation direction Ψ=900 is favorable to minimize the thermal effects around 0 values in the range of 40° to 65°. In this angular range, electromechanical coupling k$_s^2$ values of over 1% can be observed.

As can be further seen in FIG. 3d, the variation of the propagation velocity (m/s) and of the TCF (ppm/K) are actually almost in opposition of phase, so that when the propagation velocity (m/s) is at a high value, the TCF is at a high negative value (ppm/K). However, it is possible to select the cut of the crystal orientation in order to find a trade-off between the TCF and the propagation velocity value desired. For example, at around θ=42°, a TCF of about −20 ppm/K and a velocity of over 5600 m/s can be observed or at around θ=62°, a TCF of about −5 ppm/K and a velocity of about 5350 m/s can be observed. Thus, both (YX/t)/42/90° and (YX/t)/62/90° are advantageous crystallographic orientations. With such values, improved SAW devices as frequency sources, for example, filter or resonators, can be obtained for which a stable temperature and sufficiently high electrochemical coupling are necessary. In this particular example, SAW filters with bandpass of the order of 0.1% to 1% can been achieved with improved temperature stability.

Figure 4A:
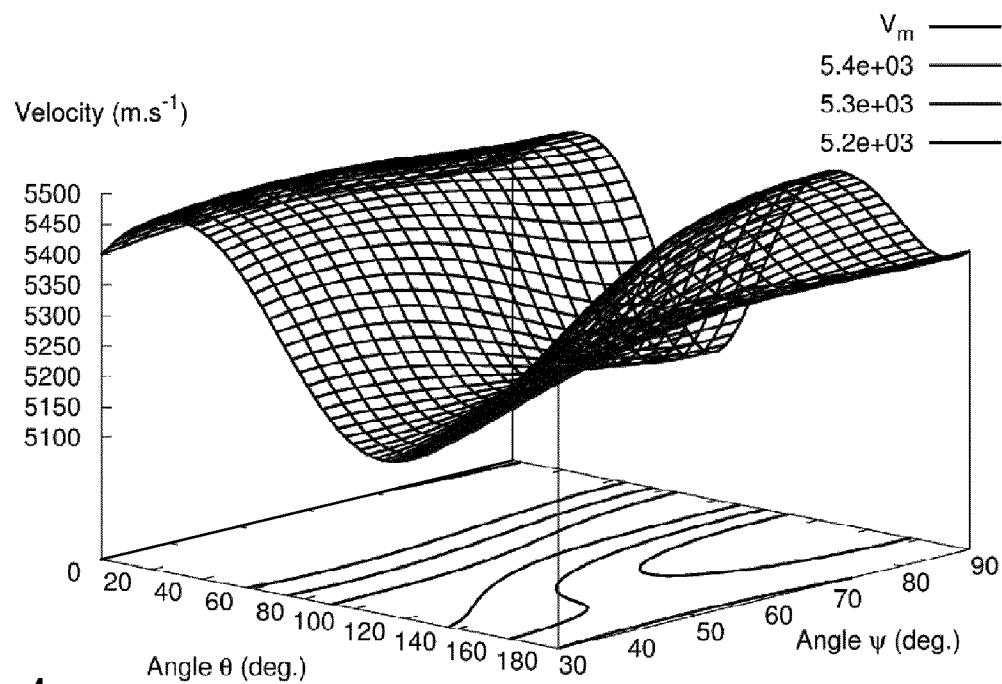
FIGS. 4a-4d illustrate the characteristics of a surface acoustic wave device using a composite substrate according to the present disclosure with a $SiO_2$ layer of 500 nm.
Figure 4B:
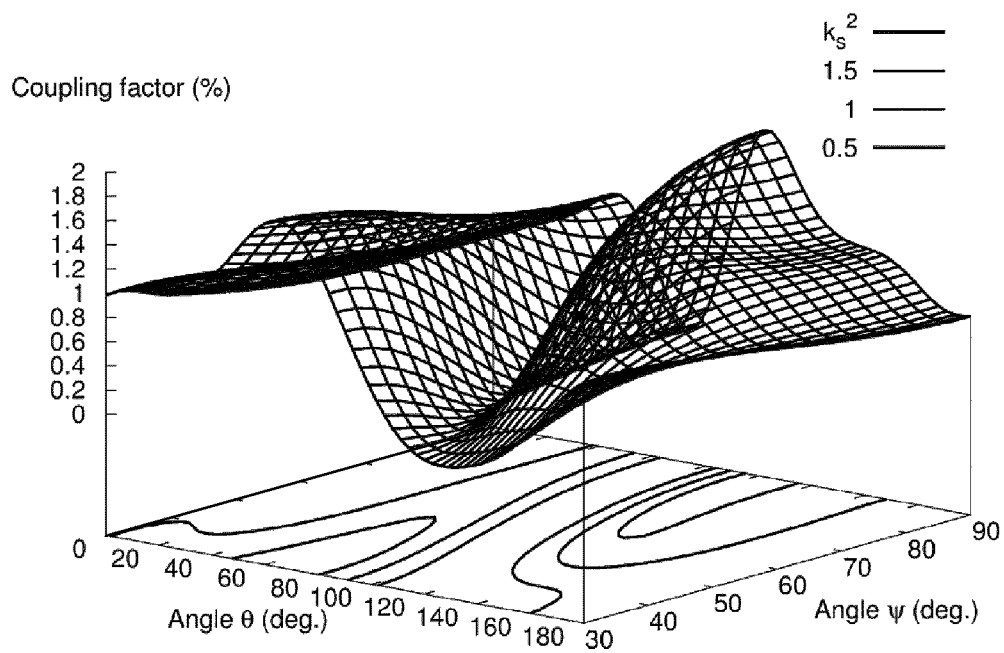
Figure 4C:
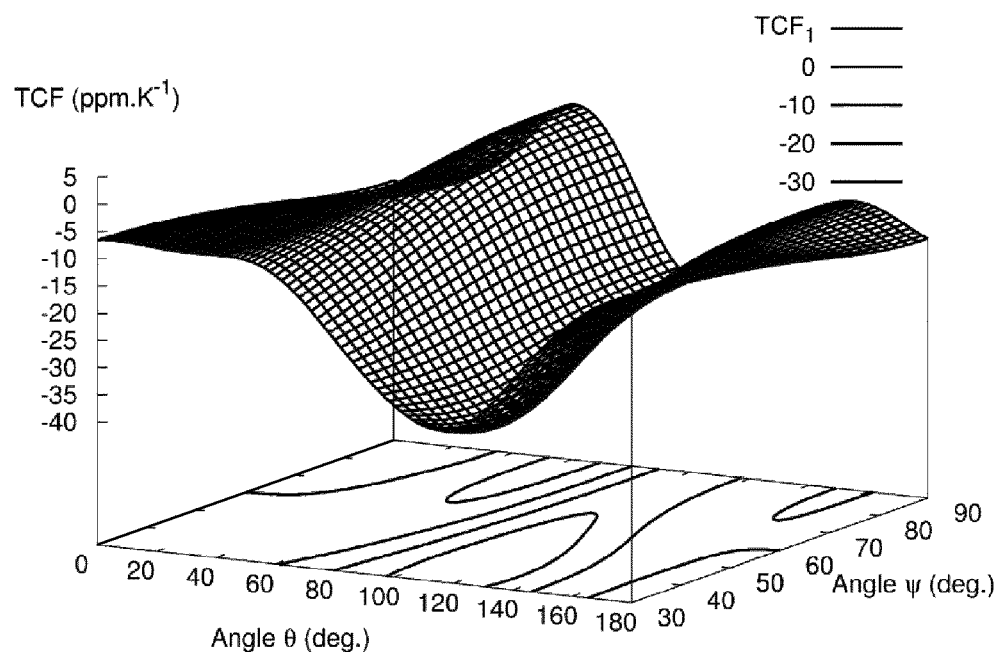

FIGS. 4a to 4d illustrate the same parameters as in FIGS. 3a to 3d, but for the case of a SiO$_2$ layer thickness of 500 nm, also for the frequency of 2 GHz. It is important to notice that the effect of the thickness of the SiO$_2$ layer is particularly visible in the TCF (FIG. 4c). By thickening the dielectric layer, it becomes thus possible to improve the temperature stability without influencing the electromechanical coupling and the propagation velocity in the same amount.

Figure 4D:
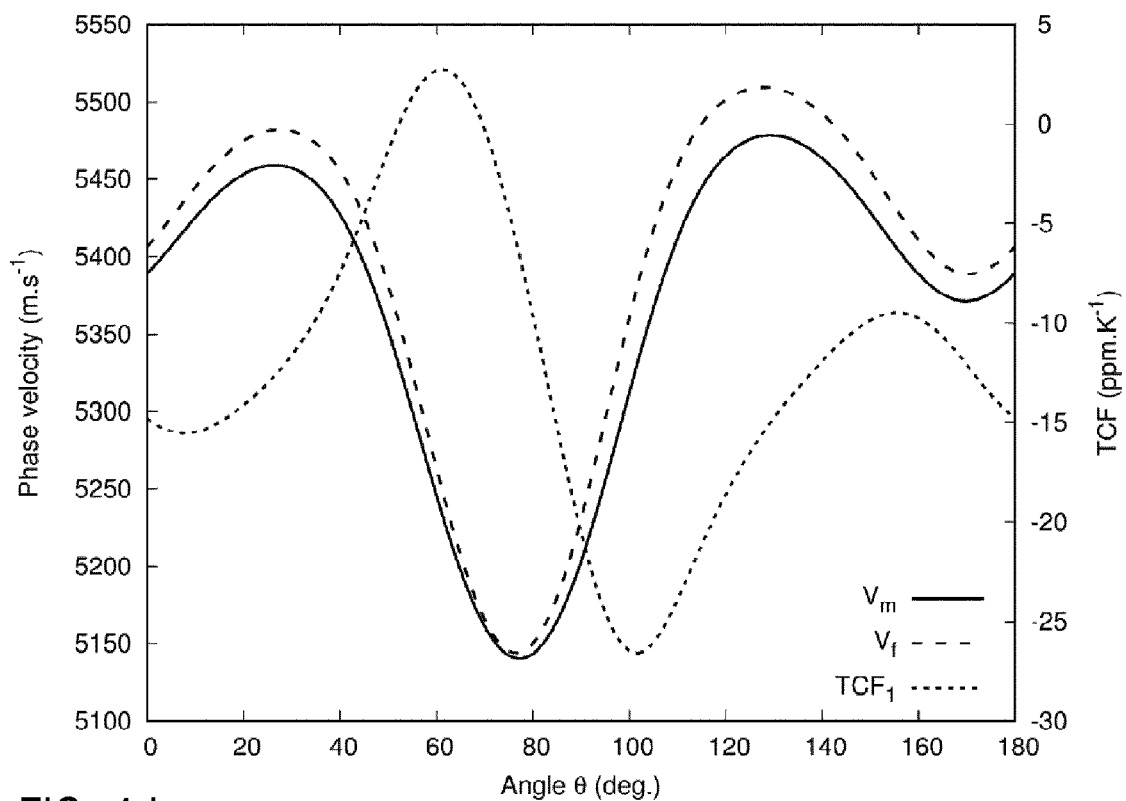

FIG. 4d, in particular, illustrates that it is even possible to cancel the thermal coefficient of frequency 1 (TCF$_1$) for several configurations. Indeed, for a crystallographic orientation with θ values close to 50° and close to 70°, the TCF$_1$ is cancelled while the propagation velocity is around 5400 m/s and 5150 m/s, respectively. However, the minimization of the effects of temperature is obtained for crystalline orientations that do not have the maximum of coupling.

However, the electromechanical coupling is substantially sensitive to a SiO$_2$ passivation layer deposited on the excitation surface and for SAW devices with a composite substrate, it is possible to reach values close to 8% with phase velocities remaining greater than 5000 m/s.

As can be seen from FIGS. 3a through 4d, a guided wave with a propagation velocity on the order of 5500 m/s, a TCF between −20 and 0 ppm/K with an electrochemical coupling coefficient varying between 0.5 and 2% can be achieved.

Figure 5:
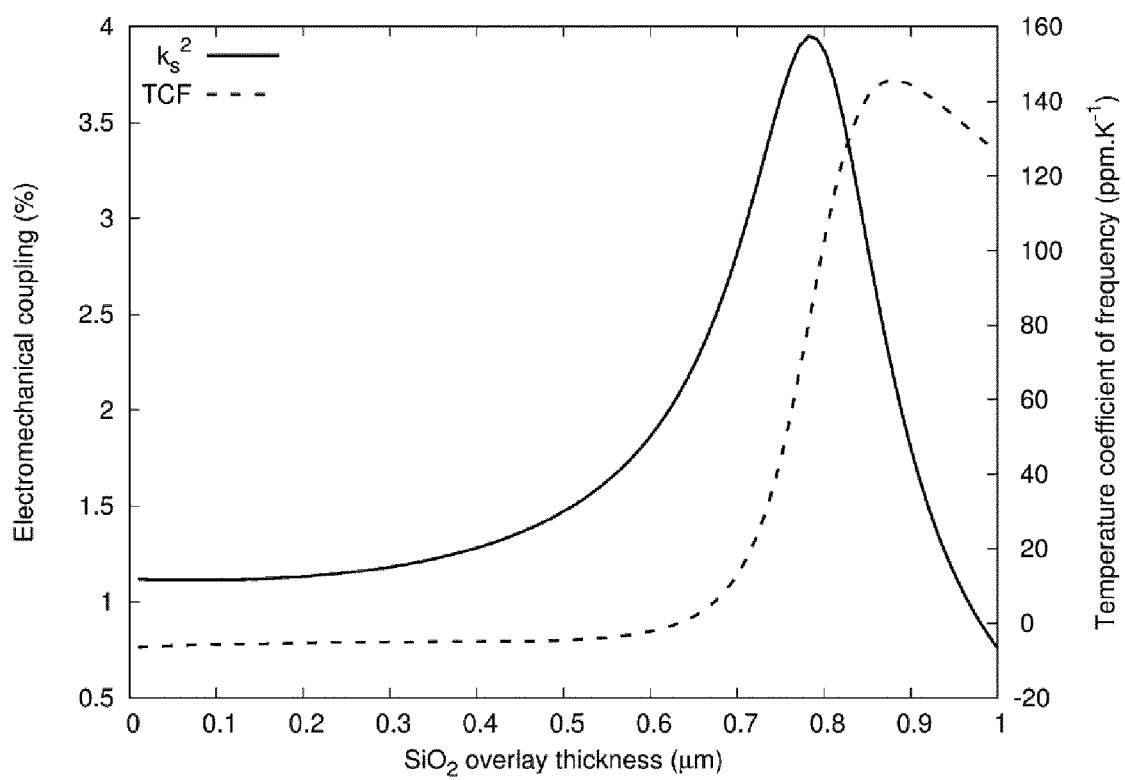
FIG. 5 illustrates the variation of the characteristics of the surface acoustic wave device as a function of the thickness of the dielectric $SiO_2$ layer.

FIG. 5 illustrates the variations of the electromechanical coupling coefficient k$_s^2$ (%) on the left Y axis and of the TCF (ppm/K) on the right Y axis, as a function of the thickness of the passivation or dielectric layer on the X axis, for a surface acoustic wave (SAW) device as described above, i.e., for the case of a LiTaO$_3$ layer with a (YX/)/42°/90° cut and for the frequency of 2 GHz.

In FIG. 5, one can see that for a thickness of about 630 nm or below, the TCF is cancelled. At this value of 630 nm, the electromechanical coupling coefficient k$_s^2$ is on the order of 2.1%. Thus, the presence of the dielectric layer maintains the temperature stability while improving the electromechanical coupling.

FIGS. 6a to 6d illustrate the characteristics of a surface acoustic wave device using a composite substrate according to the present disclosure with a SiO$_2$ layer of 200 nm, as a function of the relative thickness and of the metallization ratio of the electrodes of the transducer structure, at the Bragg condition. The composite substrate here is a 500 nm thick LiTaO$_3$ layer with a (YX/t)/42°/90° crystal cut, on 200 nm of SiO$_2$ on silicon (100) base substrate.

Figure 6A:
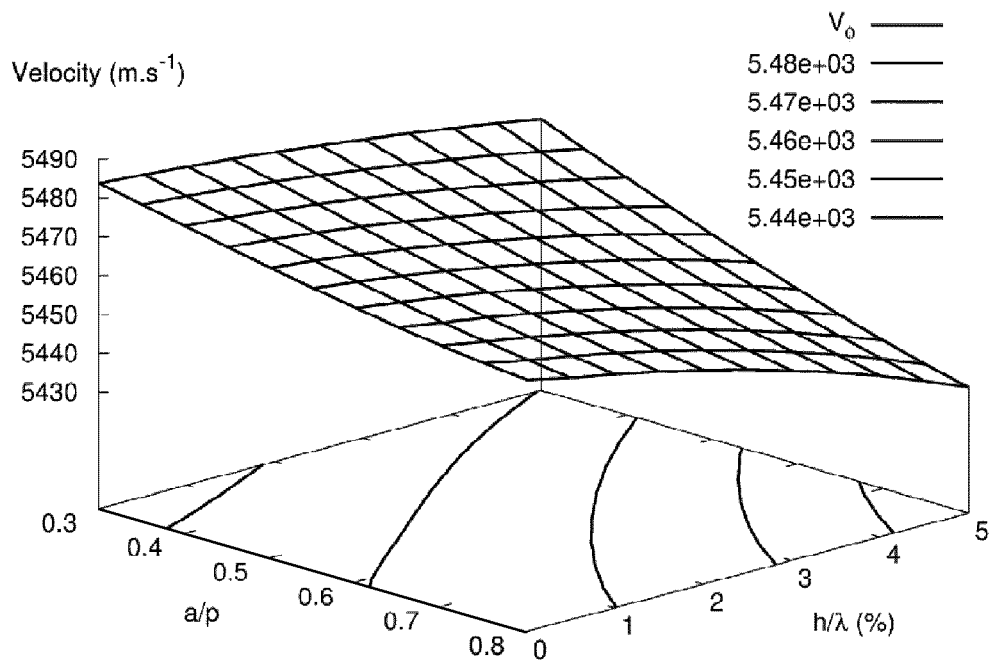
FIGS. 6a-6d illustrate the characteristics of a surface acoustic wave device using a composite substrate according to the present disclosure with a $SiO_2$ layer of 200 nm, as a function of the relative thickness and of the metallization ratio of the electrodes of the transducer structure.
Figure 6B:
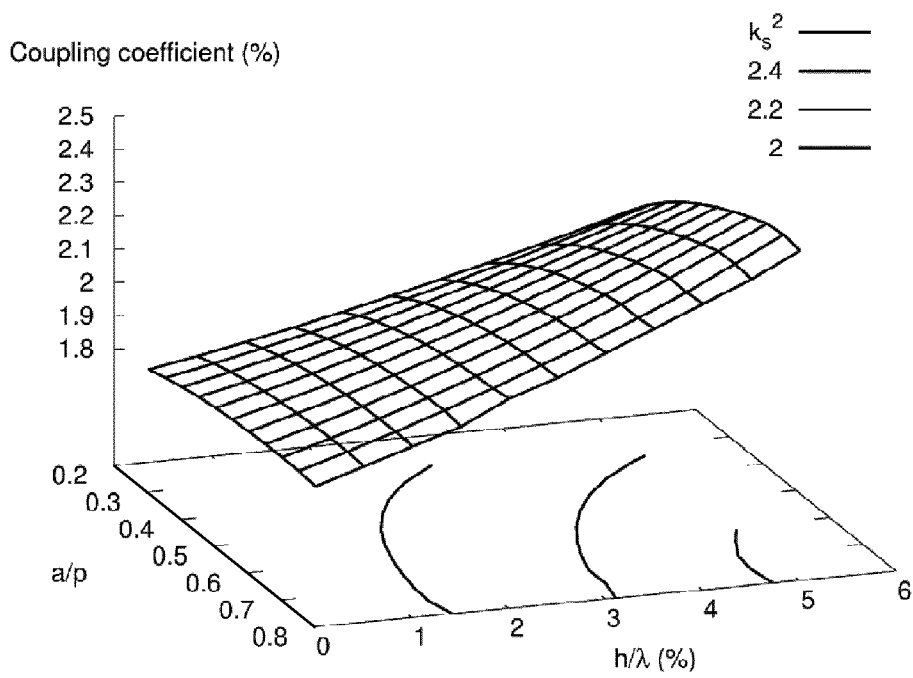
Figure 6C:
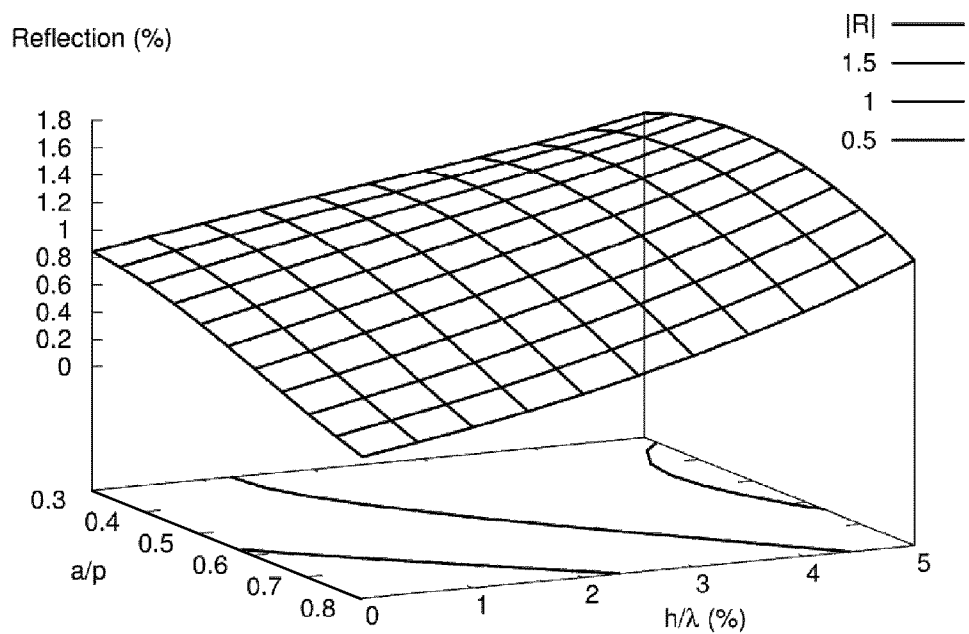
Figure 6D:
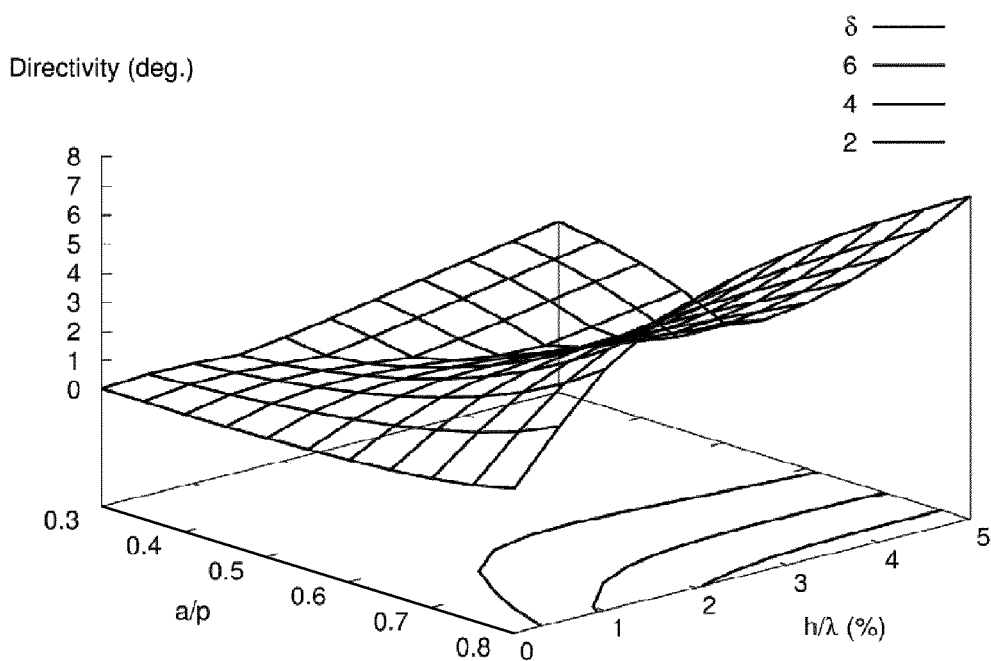

In particular, FIG. 6a shows the variation of the phase velocity (m/s), FIG. 6b shows the variation of the electromechanical coupling coefficient k$_s^2$ (%), FIG. 6c shows the variation of the reflection coefficient (%) (bandwidth of the stop band) and, finally, FIG. 6d shows the variation of the directivity for the high speed mode in such composite substrate. The directivity is defined as the ratio between the amplitude of the resonances at the input and the output of the stop band.

The calculation of the mode characteristics is essential for any SAW component design operation using this "high velocity" mode. In particular, it is important to know the evolution of the propagation velocity, the electrochemical coupling coefficient k$_s^2$ and the diffraction effects as a function of the shape of the electrodes, namely the relative thickness h/λ and the metallization ratio w/ρ with ρ and λ being the electrode pitch and the wavelength of the electrode array, respectively, and h and w being the thickness and the width of the electrode fingers, respectively. The transducer structure operates at the Bragg condition, so that ρ=λ/2.

The reflection coefficient values achieved, with values up to 1.5, as can be seen in FIG. 6c, are appropriate for the use of the SAW device as resonator.

FIG. 6a shows that phase velocities of the order of 5500 m/s can be reached, and that the phase velocity varies between 5500 m/s and 5400 m/s with increasing relative thickness h/λ of the electrode fingers of the transducer structure.

As can be seen in FIG. 6b, the electromechanical coupling coefficient k$_s^2$ actually increases with the thickness of the metal. Values of k$_s^2$ up to 2.5% can be reached. It can be also noted that for a metallization ratio w/ρ above 0.7, in particular, close to 0.8, the high speed mode exhibits an electromechanical coupling close to zero.

According to FIG. 6d, it can be seen that the directivity reaches values up to 6. However, for a metallization ratio w/ρ of the order of 0.5, it can be seen that the directivity is close to zero. This is an important and valuable aspect for the fabrication of devices close to the resolution limit of the technology, for example, when the transducer structure comprises similar electrodes width and similar interelectrode distance.

Although not shown here, the impact of the thickness of the electrode is to lower the TCF when increased.

The influence of the relative thickness h/λ and the metallization ratio w/ρ on the values of the electromechanical coupling coefficient k$_s^2$, the phase velocity, and the TCF, therefore, represents another parameter to optimize the properties of the composite substrate 7 to obtain the required electrochemical coupling coefficient k$_s^2$ and the temperature stability of the composite substrate for the desired applications of the SAW device 5.

Figure 7:
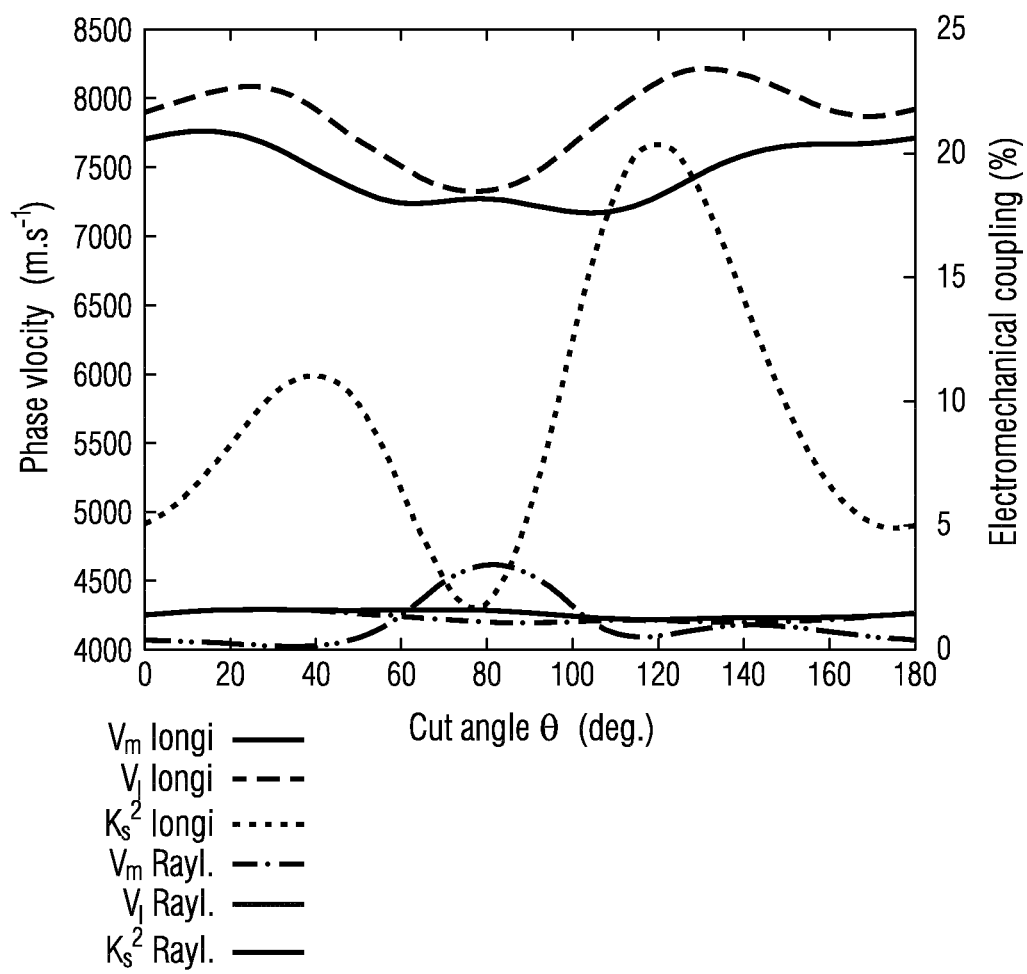
FIG. 7 illustrates the plot of the phase velocity (m/s) of the guided wave on the left Y axis and the electromechanical coupling coefficient $k_s^2$ (%) on the right Y axis, as a function of the rotation angle θ of the cut, on the X axis, for both the longitudinal modes and the Rayleigh modes when $LiNbO_3$ is used as the piezoelectric material and diamond is used as the base substrate of the composite substrate.

FIG. 7 illustrates the dispersion curves for the Rayleigh modes and the longitudinal modes of a composite substrate with a diamond base substrate and a 500 nm thick LiNbO$_3$ piezoelectric layer. The frequency of operation is 2 GHz.

In particular, the phase velocity (m/s) of the guided wave on the left Y axis and the electromechanical coupling coefficient k$_s^2$ (%) on the right Y axis are plotted as a function of varying angles of crystal orientation θ on the X axis, for a propagation direction Ψ=90° along the crystallographic X-axis, for both the longitudinal modes and the Rayleigh modes, when LiNbO$_3$ is used as the piezoelectric material and diamond is used as the base substrate of the composite substrate.

A favorable configuration for the use of longitudinal modes with lithium niobate corresponds to cutting angles θ between 100° and 150°, in particular, close to 120 with phase velocity in excess of 7000 m/s together with electromechanical coupling coefficient k$_s^2$ as high as 20%. For this configuration, the computation of the TCF of this mode with a 4 μm wavelength on a stack composed of (YX/t)/120°/90° LiNbO$_3$ and silicon dioxide SiO$_2$, 100 nm thick, and semi-infinite C-oriented diamond substrate yields values ranging from −12 to +12 ppm/K for lithium niobate thickness, respectively ranging from 350 to 500 nm.

It can be also noted that for θ between 350 and 40°, in particular, close to the (YX/t)/36/90° cut LiNbO$_3$, the Rayleigh wave exhibits a minimum coupling, below 0.5% whereas the longitudinal mode reaches a 10% electromechanical coupling coefficient k$_s$=, making this configuration advantageous for the purpose of spectral purity.

Actually, the operation of the SAW device should be used for angles θ between 35° and 400 or between 100° and 150°, in particular, close to 360 or close to 120°, with a propagation direction at 90° along the crystallographic X-axis, given the fact that for both these configurations, the coupling of the Rayleigh modes is at its minimum, below 0.5% and while an electromechanical coupling coefficient k$_s^2$ of about 11% is observed for the first configuration, values over 20% can be reached in the second configuration.

Figure 8:
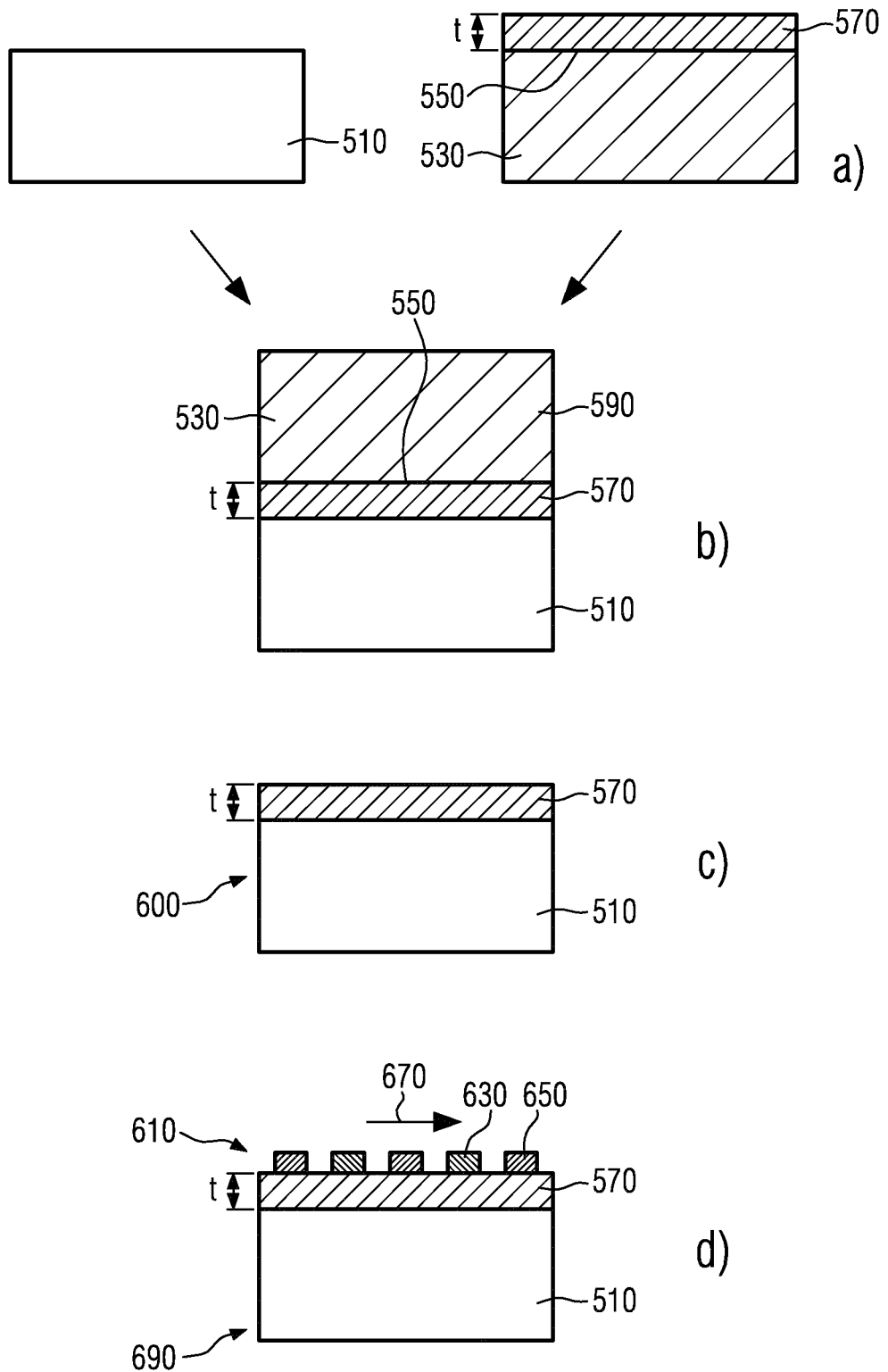
FIG. 8 shows a schematic of the steps of the method for manufacturing a surface acoustic wave device according to the present disclosure.

FIG. 8 illustrates a schematic of the steps of the method for manufacturing a surface acoustic wave device according to the present disclosure, as illustrated in FIG. 1b.

The method comprises a first part of providing a piezoelectric layer over a base substrate.

To realize this part of the process, a base substrate 510 is provided in step a). The base substrate 510 is a monocrystalline silicon substrate with an orientation (100), or any other substrate material with high acoustic wave propagation velocity, such as diamond, sapphire, silicon carbide or aluminum nitride.

In step a), a handle substrate 530 is also provided that, in this embodiment, is a single crystal piezoelectric substrate. In this embodiment, the handle substrate 530 is LiTaO$_3$, but lithium niobate (LiNbO$_3$) could also be used. A predetermined splitting area 550 is provided inside the handle substrate 530 to form a to-be-transferred piezoelectric layer 570 with a thickness t.

Furthermore, in this embodiment, the LiTaO$_3$ substrate has a (YX)θ cut according to the standard IEEE 1949 Std-176, with θ, an angle of the crystallographic orientation being between 400 and 65°. Here in particular, the LiTaO$_3$ substrate has a (YX/)/42° orientation. In the variant where LiNbO$_3$ would be used, the LiNbO$_3$ layer would then have a (YX/t)/θ/90° orientation, with θ between 350 and 40° or between 1000 and 150°. The predetermined splitting area can be realized by ion implantation as known in the art.

The thickness t of the piezoelectric layer 570 to be transferred is on the order of the operating wavelength of the final SAW device, in particular, smaller than the operating wavelength of the final SAW device. The thickness t is, in particular, in a range of 300 nm to 700 nm, such as 500 nm.

In step b), the handle substrate 530 and the base substrate 510 are attached to sandwich the to-be-transferred piezoelectric layer 570 between the remainder of the handle substrate 590 and the base substrate 510. Attachment can occur byway of bonding.

As known in the art, the piezoelectric layer 570 can be detached from the remainder of the handle substrate 590 by applying energy, in particular thermal or mechanical energy. Detachment occurs at the predetermined splitting area 550.

In the composite substrate 600, as illustrated at step c), the piezoelectric layer 570 is provided such that the piezoelectric layer 570 has a crystalline orientation with respect to the base substrate 510, such that the phase velocity of a longitudinally polarized wave travelling in the piezoelectric layer 570 is below the critical phase velocity SSBW of the base substrate 510 at which wave guiding within the piezoelectric layer 570 vanishes.

In a variant, a thin $SiO_2$ layer (not shown) can be provided on top of the base substrate 510 prior to providing the piezoelectric layer 570 to improve the coupling while keeping the temperature stability as explained above. The $SiO_2$ layer may be naturally present on the Si base substrate 510. As a preferred embodiment, the $SiO_2$ layer has a thickness less than 800 nm, in particular, in a range between 100 to 650 nm, more in particular, in a range between 600 to 650 nm.

Prior to the attachment, additional processing steps can be added, such as polishing of the side of the piezoelectric layer 570 and/or of the side of the base substrate 510 at which attachment will take place.

According to step d), a transducer structure 610 is formed on the piezoelectric layer 570, using a combination of layer deposition and patterning steps. As can be seen in FIG. 3a, the transducer structure 610 comprises two inter-digitated comb electrodes comprising each a plurality of electrode means 630 and 650, respectively. The inter-digitated comb electrodes and their respective electrode means 630 and 650 are formed of a conductive metal, for example, aluminum, or aluminum alloys or molybdenum or tungsten.

According to a particular advantageous embodiment, the inter-digitated comb electrodes are arranged such that the direction of propagation 670 of the longitudinally polarized guided wave is in the direction $\Psi=900$ to ensure a high propagation velocity together with a high temperature stability as described above.

According to the present disclosure, the patterning step is realized using an I-line lithography. Using the longitudinally polarized guided wave inside the piezoelectric layer 570 allows realizing SAW devices 690 for frequencies above 2 GHz, in particular, above 3 GHz with electrode dimensions that can be imaged using I-line lithography.

The choice of the layers, their material, their thickness and crystal orientation used for a SAW device 5, 690 is made so as to satisfy a certain number of criteria, namely the electromechanical coupling coefficient $k_s^2$, the temperature coefficient of frequency (TCF) and the acoustic wave propagation velocity of an acoustic wave travelling in the piezoelectric layer 11, 570.

According to the present disclosure, a composite substrate 7, 600 can be obtained that provides a predetermined level of electromechanical coupling of at least 0.5% of up to over 2%, in particular, in the order of up to 2.5% and a temperature stability of less than |20 ppm/K| can be achieved by combining materials with different temperature coefficient of frequency (TCF) and, if necessary, by adding a dielectric layer like $SiO_2$. For such substrates, higher acoustic wave propagation velocity of the order of 5500 m/s of a guided mode of the longitudinally polarized guided wave can be observed than for devices using the Rayleigh mode. More in particular, a composite substrate can also achieve electromechanical coupling up to 20%, with acoustic wave propagation velocity of the order of 7000 m/s or more of a guided mode of the longitudinally polarized guided wave can be observed.

Using such a composite substrate, the performance of SAW devices as well as their application ranges can be improved compared to bulk piezoelectric substrates by using I-line lithography or any lithography means allowing for high quality electrode patterning with submicron dimensions.

A number of embodiments of the present disclosure have been described. Nevertheless, it is understood that various modifications and enhancements may be made without departing from the scope of the following claims.

The invention claimed is:

1. A surface acoustic wave device using a longitudinally polarized guided wave, comprising: a composite substrate comprising a piezoelectric layer formed over a base substrate, wherein a crystalline orientation of the piezoelectric layer with respect to the base substrate is such that a phase velocity of the longitudinally polarized guided wave is below a critical phase velocity of the base substrate at which wave guiding within the piezoelectric layer vanishes.

2. The surface acoustic wave device of claim 1, wherein the piezoelectric layer is a single crystal.

3. The surface acoustic wave device of claim 1, wherein a thickness of the piezoelectric layer is on the order of a sub-wavelength range or smaller.

4. The surface acoustic wave device of claim 1, wherein the base substrate has a shear wave velocity of more than 5600 m/s.

5. The surface acoustic wave device of claim 1, further comprising a dielectric layer sandwiched between the base substrate and the piezoelectric layer.

6. The surface acoustic wave device of claim 5, wherein the dielectric layer has a thickness of less than 800 nm.

7. The surface acoustic wave device of claim 1, wherein the piezoelectric layer comprises lithium tantalate ($LiTaO_3$) or lithium niobate ($LiNbO_3$).

8. The surface acoustic wave device of claim 7, wherein the piezoelectric layer comprises lithium tantalate ($LiTaO_3$) with a crystallographic orientation defined as (YX)/θ according to the standard IEEE 1949 Std-176, with θ, an angle of the crystallographic orientation being between 40° and 65°.

9. The surface acoustic wave device of claim 8, wherein a propagation direction of the longitudinally polarized guided wave is at 90° of a crystallographic X-axis.

10. The surface acoustic wave device of claim 7, wherein the piezoelectric layer comprises lithium tantalate ($LiTaO_3$) and the base substrate comprises silicon.

11. The surface acoustic wave device of claim 1, wherein a relative thickness h/λ and/or a metallization ratio w/p of electrode fingers of a transducer structure on the piezoelectric layer, h and w being the relative thickness and width of the electrode fingers, respectively, and p and λ being an electrode pitch and wavelength of the transducer structure, respectively, are such that electromechanical coupling $k_s^2$ of the longitudinally polarized guided wave in the piezoelectric layer is between 0.5% and 2.5%.

12. The surface acoustic wave device of claim 7, wherein the piezoelectric layer comprises lithium niobate ($LiNbO_3$) with a crystallographic orientation (YX/t)/θ/90° according to the standard IEEE 1949 Std-176, with θ, an angle of the crystallographic orientation and a propagation direction of the longitudinally polarized guided wave is at 90° of a crystallographic X-axis, so that θ has a value between 35° and 40° or between 100° and 150°.

13. The surface acoustic wave device of claim 7, wherein the piezoelectric layer comprises lithium niobate ($LiNbO_3$) and the base substrate comprises diamond.

14. The surface acoustic wave device of claim 7, wherein the piezoelectric layer comprises lithium niobate ($LiNbO_3$)

with a crystallographic orientation (YX/t)/θ/Ψ according to the standard IEEE 1949 Std-176, with θ, an angle of the crystallographic orientation being between 40° and 60", and a propagation direction of the longitudinally polarized guided wave Ψ is between 80° and 100°.

15. The surface acoustic wave device of claim 7, wherein the piezoelectric layer comprises lithium niobate (LiNbO$_3$) and the base substrate comprises sapphire.

16. A surface acoustic wave filter device, comprising at least one surface acoustic wave device (SAW) according to claim 1.

17. A surface acoustic wave resonator device comprising at least one surface acoustic wave device (SAW) according to claim 1.

18. A method of fabrication of a surface acoustic wave device as described in claim 1, comprising the steps of:
  a) providing a piezoelectric layer over a base substrate; and
  b) providing a transducer structure on the piezoelectric layer;
  wherein, in step a), the piezoelectric layer is provided such that the piezoelectric layer has a crystalline orientation with respect to the base substrate such that a phase velocity of the longitudinally polarized guided wave is below a critical phase velocity of the base substrate at which wave guiding within the piezoelectric layer vanishes.

19. The method of claim 18, wherein at least one of the steps a) or b) comprises a layer transfer process.

20. The method of claim 18, wherein step b) comprises an I-line lithography patterning step to obtain a transducer structure in the surface acoustic wave device allowing a frequency limit of more than 2 GHz.

* * * * *

UNITED STATES PATENT AND TRADEMARK OFFICE
CERTIFICATE OF CORRECTION

PATENT NO. : 11,437,973 B2
APPLICATION NO. : 17/042768
DATED : September 6, 2022
INVENTOR(S) : Sylvain Ballandras, Florent Bernard and Emilie Courjon It is certified that error appears in the above-identified patent and that said Letters Patent is hereby corrected as shown below:

In the Specification

| | | | |
|---|---|---|---|
| Column 4, | Line 12, | change "and 400" to --and 40°-- |
| Column 6, | Line 29, | change "45/90°" to --45°/90°-- |
| Column 10, | Line 2, | change "Ψ=900" to --Ψ=90°-- |
| Column 10, | Line 3, | change "around 0" to --around θ-- |
| Column 10, | Line 54, | change "(YX/)" to --(YX/$t$)-- |
| Column 12, | Line 3, | change "to 120" to --to 120°-- |
| Column 12, | Line 12, | change "between 350" to --between 35°-- |
| Column 12, | Line 19, | change "and 400" to --and 40°-- |
| Column 12, | Line 20, | change "to 360" to --to 36°-- |
| Column 12, | Line 46, | change "(YX)θ" to --(YX/)θ-- |
| Column 12, | Line 48, | change "between 400" to --between 40°-- |
| Column 12, | Line 51, | change "between 350" to --between 35°-- |
| Column 12, | Line 52, | change "between 1000" and --between 100°-- |
| Column 12, | Line 63, | change "occur byway" to --occur by way-- |
| Column 13, | Line 34, | change "'Ψ=900" to --Ψ=90°-- |

In the Claims

| | | | |
|---|---|---|---|
| Claim 14, | Column 15, | Line 3, | change "and 60′′′" to --and 60°-- |
| Claim 19, | Column 16, | Line 12, | change "a) orb)" to --a) or b)-- |

Signed and Sealed this
Eleventh Day of April, 2023

Katherine Kelly Vidal
*Director of the United States Patent and Trademark Office*